(12) United States Patent
Kanakasabapathy et al.

(10) Patent No.: US 7,507,633 B2
(45) Date of Patent: Mar. 24, 2009

(54) METHOD AND STRUCTURE FOR IMPROVED ALIGNMENT IN MRAM INTEGRATION

(75) Inventors: Sivananda K. Kanakasabapathy, Hopewell Junction, NY (US); David W. Abraham, Croton on Hudson, NY (US)

(73) Assignee: International Business Machines Corproation, Armonk, NY (US)

( * ) Notice: Subject to any disclaimer, the term of this patent is extended or adjusted under 35 U.S.C. 154(b) by 292 days.

(21) Appl. No.: 11/369,516

(22) Filed: Mar. 7, 2006

(65) Prior Publication Data

US 2007/0210394 A1 Sep. 13, 2007

(51) Int. Cl.
*H01L 21/76* (2006.01)

(52) U.S. Cl. .......................... 438/401; 438/14; 438/15; 438/403; 438/462; 438/975; 257/E23.179; 257/797

(58) Field of Classification Search .................. 428/67; 257/E21.52, 797, E23.179; 438/14, 15, 400–406, 438/460–465, 975
See application file for complete search history.

(56) References Cited

U.S. PATENT DOCUMENTS

| | | | |
|---|---|---|---|
| 5,640,343 A | 6/1997 | Gallagher et al. | 365/171 |
| 6,251,745 B1 * | 6/2001 | Yu | 438/401 |
| 6,759,112 B2 * | 7/2004 | Wong | 428/67 |
| 6,858,441 B2 | 2/2005 | Nuetzel et al. | 438/3 |
| 6,914,017 B1 * | 7/2005 | Baluswamy et al. | 438/401 |
| 6,933,204 B2 * | 8/2005 | Sarma et al. | 438/401 |
| 2004/0207097 A1 * | 10/2004 | Carpi et al. | 257/797 |
| 2004/0239934 A1 * | 12/2004 | Bowes | 356/400 |
| 2005/0031967 A1 * | 2/2005 | Ito | 430/5 |
| 2005/0079683 A1 * | 4/2005 | Sarma et al. | 438/401 |
| 2005/0186753 A1 * | 8/2005 | Chen et al. | 438/401 |
| 2005/0254180 A1 | 11/2005 | Kanakasabapathy et al. | 360/324.2 |
| 2006/0024923 A1 * | 2/2006 | Sarma et al. | 438/462 |
| 2006/0273242 A1 * | 12/2006 | Hunsche et al. | 250/208.1 |

OTHER PUBLICATIONS

"A 0.18 μm Logic-based MRAM Technology for High Preformance Nonvolatile Memory Applications", A.R.. Sitaram et al., 2003, Symposium on VLSI Technology Digest of Technical Papers, pp. 15-16.
"Magnetoresistive Random Access Memory Using Magnetic Tunnel Junctions" Saied Tehrani et al. ,May 2003, Proceedings of the IEEE vol. 91, No. 5, pp. 703-714.
"Memories of Tomorrow", William Reohr et al. , Sep. 2002, IEEE Ciruits & Devices Magazine, pp. 17-27.
"The Science and Technology of Magnetoresistive Tunneling Memory", Brad N. Engel et al., Mar. 2002, IEEE Transactions on Nanotechnology, vol. 1 No. 1.

* cited by examiner

*Primary Examiner*—M. Wilczewski
*Assistant Examiner*—LaTanya Crawford
(74) *Attorney, Agent, or Firm*—Cantor Colburn LLP; Ido Tuchman

(57) ABSTRACT

A method for implementing alignment of a semiconductor device structure includes forming first and second sets of alignment marks within a lower level of the structure, the second set of alignment marks adjacent the first set of alignment marks. An opaque layer is formed over the lower level, including the first and second sets of alignment marks. A portion of the opaque layer corresponding to the location of said first set of alignment marks is opened so as to render the first set optically visible while the second set of alignment marks initially remains covered by the opaque layer. The opaque layer is patterned using the optically visible first set of alignment marks, wherein the second set of alignment marks remain available for subsequent alignment operations in the event the first set becomes damaged during patterning of the opaque layer.

5 Claims, 4 Drawing Sheets

METHOD AND STRUCTURE FOR IMPROVED ALIGNMENT IN MRAM INTEGRATION

BACKGROUND

The present invention relates generally to semiconductor device processing and, more particularly, to a method and structure for improved alignment in Magnetic (or magneto-resistive) random access memory (MRAM) integration.

MRAM is a non-volatile random access memory technology that could replace the dynamic random access memory (DRAM) as the standard memory for computing devices. The use of MRAM as a non-volatile RAM would allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by an insulating non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is usually maintained in a preassigned direction, while the magnetic moment of the magnetic layer on the other side of the tunnel barrier (also referred to as a "free" layer) may be switched during operation between the same direction and the opposite direction with respect to the fixed magnetization direction of the reference layer. The orientations of the magnetic moment of the free layer adjacent to the tunnel junction are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is typically "low" when the magnetization is parallel, and "high" when the magnetization is antiparallel. Accordingly, a detection of changes in resistance allows a MRAM device to provide information stored in the magnetic memory element (i.e., a read operation). There are different methods for writing a MRAM cell; for example, a Stoner-Wohlfarth astroid MRAM cell is written to through the application of fields to exceed a critical curve or stability threshold, in order to magnetically align the free layer in a parallel or antiparallel state. The free layer is fabricated to have a preferred axis for the direction of magnetization called the "easy axis" (EA), and is typically set by a combination of intrinsic anisotropy, strain induced anisotropy, and shape anisotropy of the MTJ.

One type of existing MRAM device architecture is what is referred to as a field effect transistor (FET) based configuration. In the FET-based configuration, each MRAM cell includes a select transistor associated therewith, in addition to an MTJ. By keeping the select transistors to cells not being read in a non-conductive state, shunting current is prevented from flowing through neighboring devices. The tradeoff with the FET-based configuration versus a cross point cell (XPC)-based configuration (in which each cell is located at the crossing point between parallel conductive wordlines in one horizontal plane and perpendicularly running bit lines in another horizontal plane) is the area penalty associated with the location of the select transistors and additional metallization lines. In a conventionally formed FET-based MRAM device, the MTJ is typically formed over a conductive metal strap that laterally connects the bottom of the MTJ to the select FET (through a via, metallization line and contact area stud). A metal hardmask layer or via on the top of the MTJ is coupled to an upper metallization line.

One of the challenges in forming MRAM devices during Back End of Line (BEOL) processing of Complimentary Metal Oxide Semiconductor (CMOS) integration lies in the lithographic alignment of MTJs to the metal level beneath. In most conventional BEOL processing approaches, the dielectric films used are optically transparent, thereby allowing a stepper to view the alignment marks of the metallization level beneath for alignment thereto. However, since the MTJ metal stack is opaque, the alignment marks of the metal level beneath an MTJ stack are not visible.

One existing approach to alignment for MTJ stacks is to introduce topography into the alignment mark area of the underlying metal level that can be seen through the MTJ, such as taught in U.S. Pat. No. 6,858,441. However, the chemical mechanical polishing (CMP) prior to MTJ stack deposition that is associated with this technique can lead to dishing and trapped slurry residue, this making the alignment more difficult. In another approach (e.g., U.S. Pat. No. 6,933,204, assigned to the assignee of the present application), a portion of the opaque MTJ stack layer over a set of alignment marks is removed prior to hardmask patterning that is aligned to a lower metallization level. The marks are visible beneath an optically transparent layer once the portion of the opaque MTJ layer is removed.

However, subsequent to the initial tunnel junction lithographic alignment to the lower metal level, the resulting hardmask and metal strap etch processes can degrade the optically exposed alignment marks, which are only protected by a thin optically transparent layer (e.g., Ta/TaN). As a result, further alignment steps that also utilize the same alignment marks (e.g., aligning vias that directly connect an upper level metal line to a lower metal line) can become more difficult to perform. Accordingly, it would be desirable to be able to implement alignment of MTJ stacks in a manner that utilizes optically transparent alignment marks, but that also maintains the capability for additional alignment following etch processes subsequent to a first alignment.

SUMMARY

The foregoing discussed drawbacks and deficiencies of the prior art are overcome or alleviated by a method for implementing alignment of a semiconductor device structure. In an exemplary embodiment, the method includes forming first and second sets of alignment marks within a lower level of the structure, the second set of alignment marks adjacent the first set of alignment marks. An opaque layer is formed over the lower level, including the first and second sets of alignment marks. A portion of the opaque layer corresponding to the location of said first set of alignment marks is opened so as to render the first set optically visible while the second set of alignment marks initially remains covered by the opaque layer. The opaque layer is patterned using the optically visible first set of alignment marks.

In another embodiment, a method for aligning a magnetic tunnel junction (MTJ) element in a semiconductor memory array includes forming first and second sets of alignment marks within a lower metal level, the second set of alignment marks adjacent the first set of alignment marks, and forming an MTJ stack layer over the lower metal level, including the first and second sets of alignment marks. A portion of the MTJ stack layer corresponding to the location of the first set of alignment marks is opened so as to render the first set of alignment marks optically visible while the second set of alignment marks initially remains covered by the MTJ stack layer. The MTJ stack layer is lithographically patterned using the optically visible first set of alignment marks.

In still another embodiment, a magnetic random access memory (MRAM) structure includes first and second sets of alignment marks formed within a kerf region of a lower metal level, the second set of alignment marks adjacent the first set of alignment marks, an MTJ stack layer formed over the lower metal level, including the first and second sets of alignment marks, and an optically transparent layer formed between the lower metal level and the MTJ stack layer.

BRIEF DESCRIPTION OF THE DRAWINGS

Referring to the exemplary drawings wherein like elements are numbered alike in the several Figures.

DETAILED DESCRIPTION

In the formation of MRAM devices, the alignment of MTJ stacks to the metal line underneath poses a particularly tricky problem since the MTJ stack itself is opaque. Proper alignment, which is achieved through the use of a lithographic stepper prior to printing of the pattern, is based on the reflection of light/laser from the alignment structures etched on the layer underneath. The position of the alignment marks is calculated and the wafer is thus positioned accurately on the stage by the stepper feedback mechanism.

However, because the MTJ stack materials are opaque, this does not allow the stepper to otherwise "see" these alignment marks. Accordingly, one way this problem has been addressed in the past is through the creation of surface topography with the alignment marks, as discussed above, in order to align opaque junctions. The formation of such alignment marks with topographic characteristics is typically implemented by etching out copper alignment marks using a tantalum nitride (TaN) hardmask, followed by removal of the TaN by chemical mechanical polishing (CMP), and deposition of the magnetic stack and hardmask layers. The resultant topography on the MTJ stack is employed for alignment. Again, this approach may result in slurry trapping in the alignment marks during prior TaN CMP, thus making alignment rather difficult.

Figure 1:
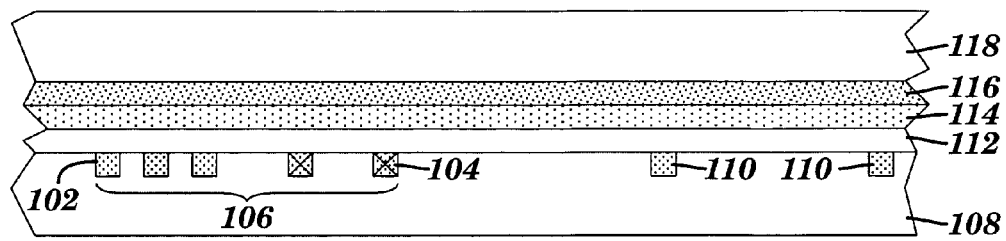
FIGS. 1 through 5 are cross sectional views of a previously disclosed MRAM processing sequence in which a portion of an opaque MTJ stack layer over a set of alignment marks is removed prior to hardmask patterning and lower metal level alignment.

Referring initially to FIG. 1, there is shown a cross sectional view of a portion of processing of an MRAM device prior to an alignment step in which a conductive hardmask is aligned to lower level conductors. In the example depicted, the lower metal level represents the M2 wiring level of an FET-based MRAM.

In the conventional alignment mark scheme shown in FIG. 1, a set of alignment marks 102 and associated overlay boxes 104 (collectively referred to hereinafter as "alignment marks" 106 or simply "marks") are formed in a dielectric layer 108, along with lower metal lines 110. An interlevel dielectric (ILD) layer 112 is formed over the alignment marks, for the formation of a strap via (not shown in the Figures for purposes of simplicity, which connects the M2 metal lines to a corresponding lateral strap of the FET MRAM device). An optically transparent layer 114 (such as Ta/TaN, for example) is formed over the ILD layer 112 prior to deposition of the opaque MTJ stack layer, collectively shown as 116. Then, a relatively thick conductive hardmask layer 118 (e.g., titanium nitride (TiN)) is formed atop the MTJ stack layer 116.

Figure 2:
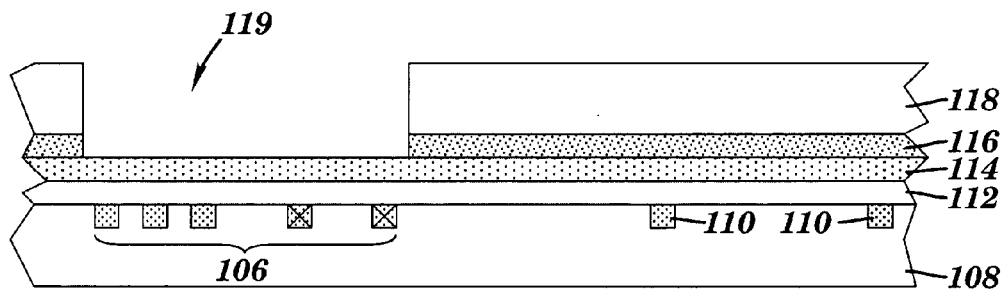
Figure 3:
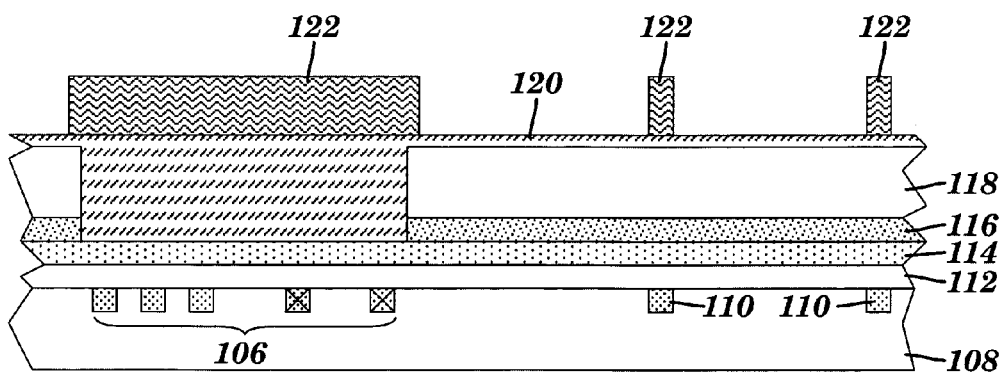

In accordance with the previously described technique (U.S. Pat. No. 6,933,204), a portion of the hardmask layer 118 and MTJ stack layer 116 above the alignment marks 106 is opened by a block mask, as shown in FIG. 2. This opening 119 allows the marks 106 to be visible by lithography equipment through the optically transparent layer 114 and LD layer 112. In this manner, a tunnel junction reticle may be aligned to the M2 wordlines 110 in the tunnel junction lithographic process. As shown in FIG. 3, an antireflective (ARC) layer 120 and photoresist 122 (both optically transparent) cover the partially excavated alignment mark site, protecting the transparent layer 114 and alignment marks 106 from further etching during the definition of the tunnel junction hardmask. However, since the MTJ stack material 116 beneath the metal hardmask 118 is sputtered in a hot cathode during the patterning thereof, such a process would lead to resist reticulation and impregnation of any resist 122 by the magnetic material being sputtered from the field area.

Figure 4:
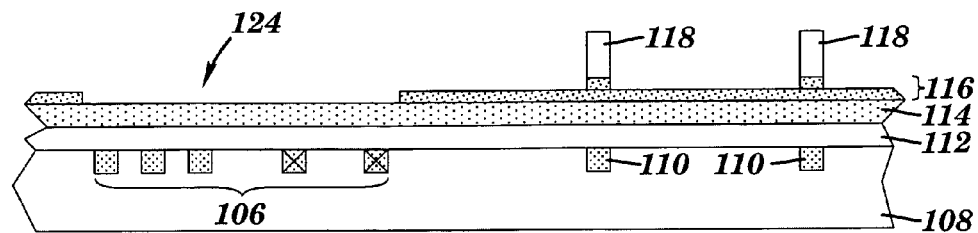
Figure 5:
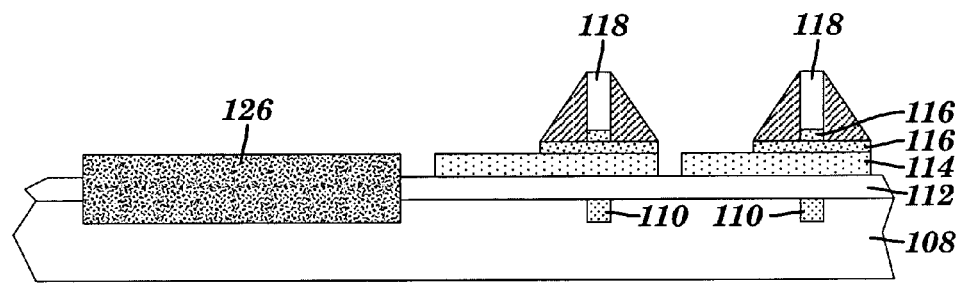
Figure 6:
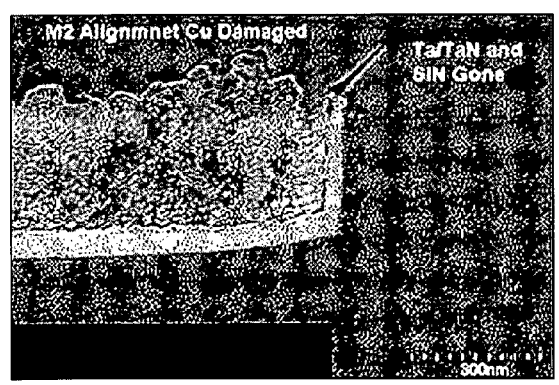
FIG. 6 is an image of an alignment mark metal that is roughened by exposure to ion bombardment in MTJ and strap etch processes.

Thus, to prevent this occurrence, the resist layer 122 and ARC layer 120 are stripped immediately after the metal hardmask etch. The resulting hardmask pattern is then transferred to a top portion of the magnetic stack underneath by a subsequent etch, as shown in FIG. 4. From this point forward, there is no longer any material masking/protecting the partially excavated M2 alignment mark site 124. Accordingly, during the MTJ stack sputter, during the partial MTJ etch, or during a subsequent strap etch where the remaining bottom portion of the MTJ stack is etched with a mask to electrically isolate adjacent MTJs, the M2 alignment marks 106 are rendered vulnerable to additional damage as illustrated by the shaded area 126 in FIG. 5. Byway of example, FIG. 6 illustrates a failure analysis image of M2 alignment copper that is roughened by exposure to ion bombardment in the MTJ and strap etch processes. Where an etch stop layer is used within an MTJ stack layer (e.g., as disclosed in U.S. Patent Publication 2005/0254180, also assigned to the assignee of the present application), the problem could be exacerbated even further due to the additional amount of etching.

Because the copper in the M2 metal lines 110 is covered by the MTJ stack 116 the entire time in the TJ and MA etches, it is therefore not exposed to damage. On the other hand, the M2 alignment marks 106 left vulnerable to damage are subject to surface roughening as described above. This roughening of the copper surface of the alignment marks 106 in turn results in an ill-defined reflection of the laser light that is shined upon the marks in the litho stepper for subsequent mask levels. For example, when attempting to align a via for connecting the strap (bottom) of the MTJ stack 116 to a corresponding M2 line 110, the scattering of light from the damaged Cu surface results in poor alignment and attendant yield loss.

Therefore, in accordance with an embodiment of the invention, there is disclosed an improved alignment mark and masking scheme for magnetic tunnel junction elements that circumvents the above described alignment problems associated with a "single mark" technique that utilizes a singular set of alignment marks and overlay boxes. Briefly stated, an additional set of alignment marks and overlay boxes is formed in the kerf region of a wafer level. By forming two complete sets of alignment marks, and by patterning the hardmask/MTJ stack open step such that only one of the two sets of marks is optically exposed, the second set of alignment marks not exposed still remains protected (along with the lower level metal lines to which alignment is sought).

Figure 7:
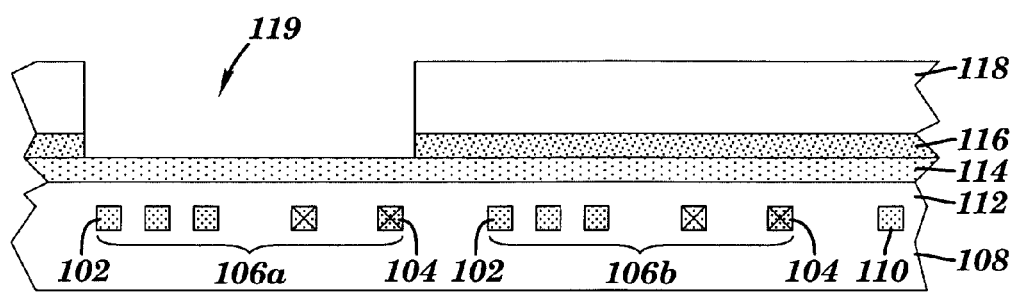
FIGS. 7 and 8 are cross sectional views of an MRAM processing sequence using first and second sets of alignment marks, in accordance with an embodiment of the invention.

Referring now to FIG. 7, there is shown a cross-sectional view of a portion of processing of an MRAM device prior to an alignment step in which a conductive hardmask is aligned to lower level conductors. For ease of illustration, like elements are designated with the same reference numerals as in earlier figures. Again, in the example depicted, the lower metal level represents the M2 wiring level of an FET-based MRAM. However, it should be understood that although the dual alignment mark methodology presented herein is in the context of MRAM device processing, it is contemplated that the technique is equally applicable to other types of semiconductor structures in which alignment of opaque elements is carried out.

As will be particularly noted from FIG. 7, in addition to a first set of alignment marks 106a (alignment marks 102 and overlay boxes 104) formed in a dielectric layer 108, a second set of alignment marks 106b (having alignment marks 102 and overlay boxes 104) is also formed in a kerf region of dielectric layer 108. One of the M2 metal lines 110 is also shown adjacent the second set of alignment marks 106b. For alignment purposes, it is seen that the block mask opening 119 (as described above) optically exposes the first set of alignment marks 106a, but the second set of alignment marks 106b is still covered by the opaque MTJ stack layer 116 and hardmask prior to hardmask alignment to the M2 metal lines 110. In other words, the optically exposed set of alignment marks 106a is used for hardmask alignment, while the second set 106b is not.

Figure 8:
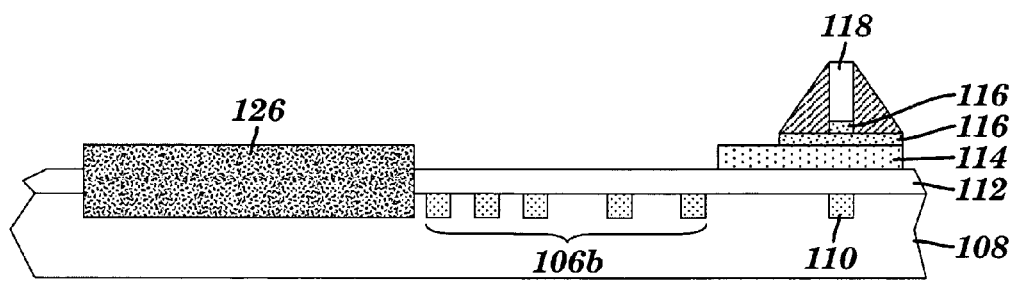
Figure 9:
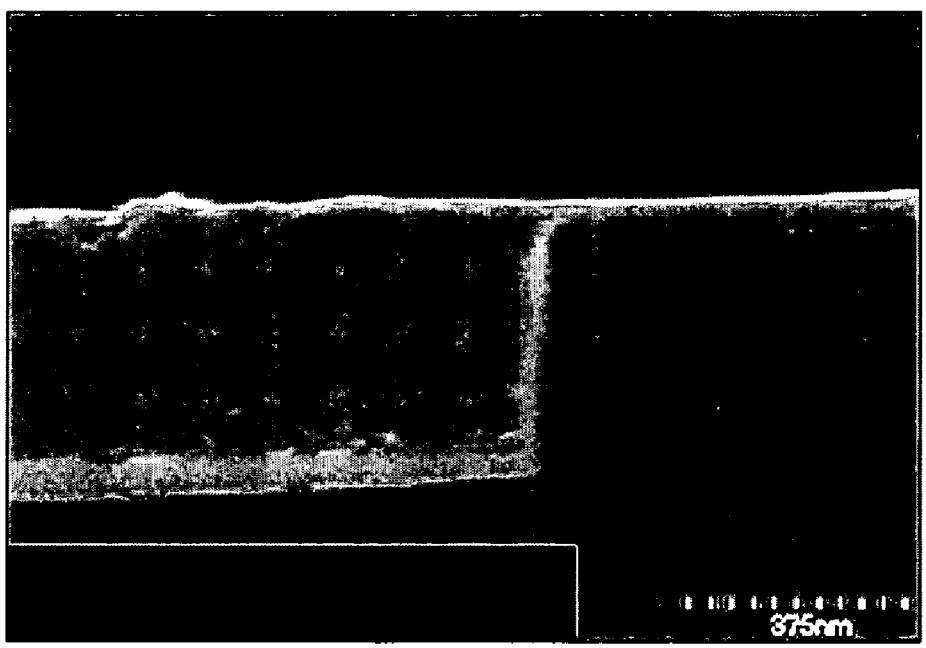
FIG. 9 is an image of a second set of alignment mark metal that is left undisturbed through the dual alignment mark scheme of FIGS. 7 and 8.

Thus, following the subsequent etch processing of the MTJ stack to form the tunnel junctions and strap portions of the device, the first set of alignment marks 106a are still subject to being damaged, as shown by region 126 in FIG. 8. However, the second set of marks 106b is undamaged. For example, FIG. 9 is an analysis image of alignment mark metal that is left undisturbed through the dual alignment mark scheme of FIGS. 7 and 8. Moreover, since both the first and second sets of alignment marks are formed in the same mask level, it is still possible to effectively align with the first set of marks 106a (although damaged) by aligning with the second set of marks 106b and using a constant offset (designed into the M2 level reticle as the offset between the first and second set of marks).

Although the above described approach utilizes more real estate in the kerf regions of the metal level(s) where the dual alignment marks are formed, there is a significant improvement in terms of the integration capability of MRAM devices with respect to standard CMOS processing. Specifically, the presence of a second set of alignment marks that are undamaged by subsequent MRAM etch processes are available for downstream integration steps associated with standard CMOS integration.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing alignment of a semiconductor device structure, the method comprising:
   forming first and second sets of alignment marks within a lower level of the structure, said second set of alignment marks adjacent said first set of alignment marks, wherein said first set of alignment marks includes both alignment marks and overlay boxes, and said second set of alignment marks includes both alignment marks and overlay boxes;
   forming an opaque layer over said lower level, including said first and second sets of alignment marks;
   opening a portion of said opaque layer corresponding to the location of said first set of alignment marks so as to render said first set of alignment marks optically visible while said second set of alignment marks initially remains covered by said opaque layer;
   lithographically patterning said opaque layer, using said optically visible first set of alignment marks; and
   measuring overlay errors with respect to said overlay boxes included within said second set of alignment marks; and
   adjusting said measured overlay errors by a constant offset, said constant offset representing an offset between said overlay boxes included within said first set of alignment marks and said overlay boxes included within said second set of alignment marks, thereby effectively measuring overlay errors with respect to said overlay boxes included within said first set of alignment marks.

2. The method of claim 1, wherein the first and second set of alignment marks are formed in a kerf region of the lower level of the structure.

3. The method of claim 1, wherein the first set of alignment marks includes both alignment marks and a first set of overlay boxes, and the second set of alignment marks includes both alignment marks and a second set overlay boxes.

4. The method of claim 1, further comprising forming an optically transparent layer between the lower level and the opaque layer.

5. The method of claim 1, further comprising:
   lithographically patterning additional features of the structure, using the second set of alignment marks; and
   adjusting a reticle by a second constant offset, the second constant offset representing an offset between the first and second set of alignment marks, thereby aligning the additional features using the first set of alignment marks.

* * * * *